United States Patent [19]

Hingorany

[11] Patent Number: 5,022,144
[45] Date of Patent: Jun. 11, 1991

[54] METHOD OF MANUFACTURE POWER HYBRID MICROCIRCUIT

[75] Inventor: Prem R. Hingorany, Broomfield, Colo.

[73] Assignee: Explosive Fabricators, Inc., Louisville, Colo.

[21] Appl. No.: 318,157

[22] Filed: Mar. 2, 1989

[51] Int. Cl.$^5$ .............................................. H01R 43/00
[52] U.S. Cl. ....................... 29/854; 29/421.2; 220/200; 228/107; 228/108; 437/221; 437/222; 437/224
[58] Field of Search ............... 228/107, 108; 29/825, 29/854, 846, 421.2; 437/220, 222, 221, 224; 220/200

[56] References Cited

U.S. PATENT DOCUMENTS

| | | | |
|---|---|---|---|
| 3,614,827 | 10/1971 | Knop et al. | 228/107 |
| 3,720,986 | 3/1973 | Cranston | 228/107 X |
| 3,998,374 | 12/1976 | Cranston et al. | 228/107 |
| 4,192,433 | 3/1980 | Hascoe | 228/175 X |
| 4,356,047 | 10/1982 | Gordon et al. | 220/200 X |
| 4,506,108 | 3/1985 | Kersch et al. | 437/221 X |
| 4,640,438 | 2/1987 | Trevison et al. | 220/200 X |

*Primary Examiner*—Carl E. Hall
*Assistant Examiner*—Carl J. Arbes
*Attorney, Agent, or Firm*—Fields, Lewis, Pittenger & Rost

[57] ABSTRACT

The present invention is a package for housing microcircuit components and the method of manufacturing the same, the latter of which includes the steps of explosively bonding first and second dissimilar metals to produce a base member, machining that base member to produce a flat bottom portion with upstanding side walls defining an interior volume in the first metal, the side walls of which are surmounted by a ring formed of the second metal, whereby the said ring can be low temperature welded to a cover piece without adversely thermally affecting the metallurgical properties of the first metal.

10 Claims, 1 Drawing Sheet

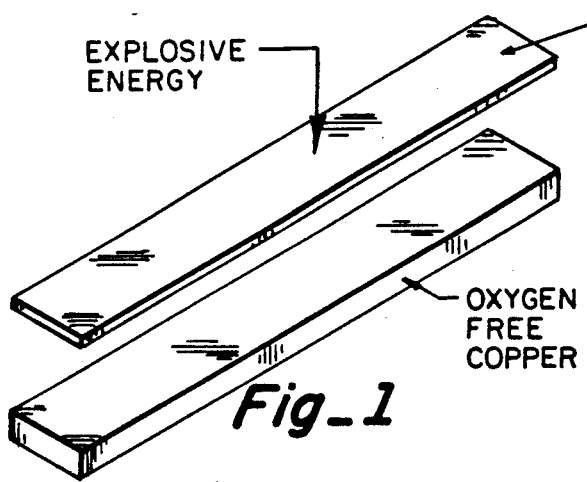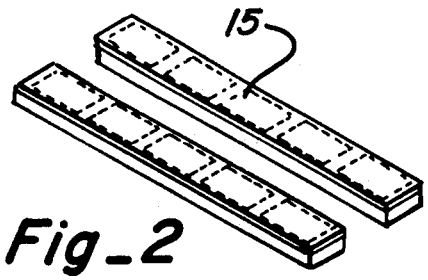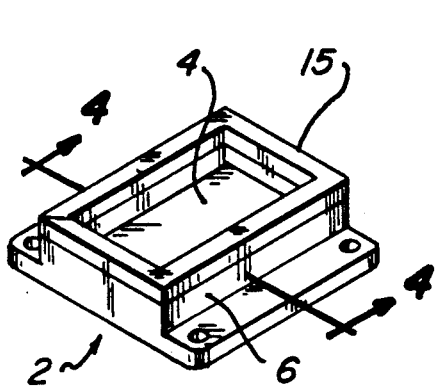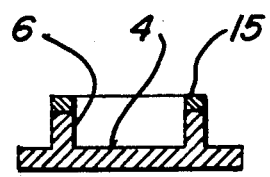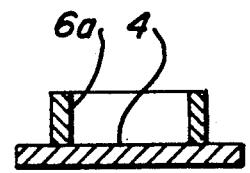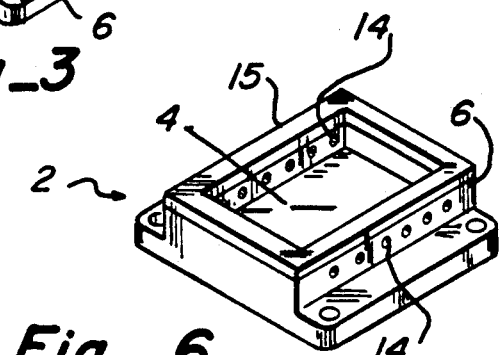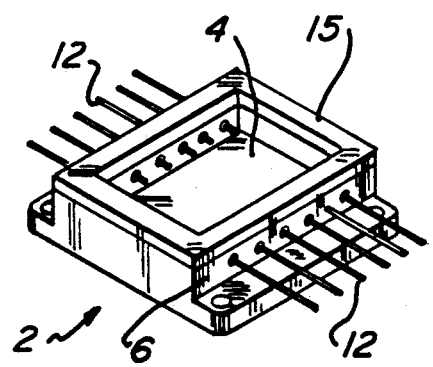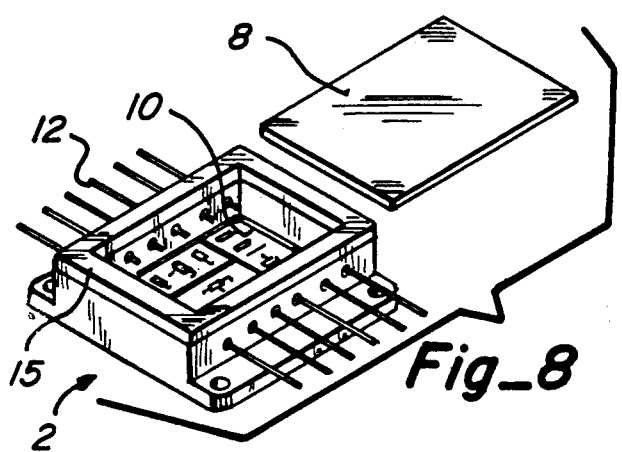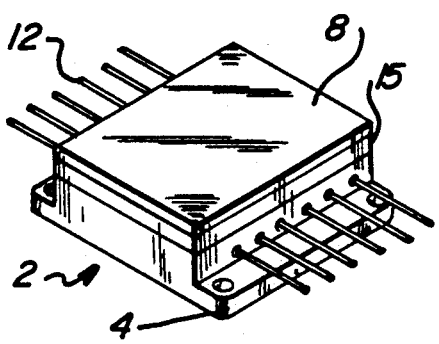

METHOD OF MANUFACTURE POWER HYBRID MICROCIRCUIT

FIELD OF THE INVENTION

The present invention relates generally to the art of packaging microcircuits and particularly high power hybrid microcircuits. In this technology, several thin-film semiconductor devices are placed in one microcircuit package. The interconnects are accomplished by placing the semiconductor devices on ceramic substrates printed with thick/thin film metallized tracks. Hence, this is a "hybrid" semiconductor containing several devices of both thick and thin film technologies all contained in one microcircuit package. This invention specifically pertains to the hybrid package itself, particularly useful in packaging several high power semiconductor devices.

BACKGROUND OF THE INVENTION

In the current art of building metal hybrid microcircuit packages, the most common metals which are being used are cold rolled steel, stainless steel, molybdenum, aluminum, copper, a dispersion hardened copper, such as "Glidcop" which as manufactured by SCM Metal Products, Inc. of Cleveland, OH and Kovar (a well-known iron-nickel-cobalt alloy). The most popular and heretofor technically advantageous metal with which to build a microcircuit package is Kovar. The normal Kovar package is a box-shaped enclosure comprising a single piece sidewall that is high-temperature brazed to the package bottom. Alternatively, the bottom and side wall are stamped from a single sheet of Kovar material. Lead holes are then drilled or punched into the bottom, e.g. in the familiar dual-in-line or plug-in configurations or in the side wall, e.g. in the flat pack or butterfly configuration. The leads, also most commonly made of Kovar, are glass-sealed into the package to complete the assembly. The glass serves both to insulate the leads from the body and to form a hermetic seal.

Typically, this type of package is fabricated by epoxying or soldering the ceramic substrate containing the semiconductor devices to the bottom of the package, wiring the thick film metal tracks to the leads, as required, and hermetically welding a Kovar lid to the sidewalls to seal the package. This assembly, known as a hybrid microcircuit, can then be soldered onto a printed wiring board and used similarly to an ordinary discrete microcircuit containing only a single semiconductor device. The advantage of a hybrid microcircuit is a decrease in weight and volume over the equivalent number of discrete devices. The main advantage of using Kovar for the package is that its coefficient of thermal expansion is similar to both the ceramic substrates and the glass seals. Consequently, the complete assembly expands and contracts at the same rate. In addition to this advantage, no excessive thermal stresses are developed in the parts of the assembly during the temperature extremes encountered during fabrication and subsequent environmental testing. Unless thermally matching materials are employed, damage from thermally induced stress occurs, such as the cracking of substrates, glass seals, weld joints, and braze joints, resulting in loss of hermeticity. Hermeticity and internal atmosphere requirements, and the proscription against loose internal particles are the main reasons metal packages are chosen over ceramic or plastic type packages.

The particular advantage in using metal packages is that they can be sealed in a conventional seam sealing machine which ensures control over the internal atmosphere of the package. A seam sealer consists of three internally connected chambers. The first (entrance) chamber is a vacuum bake oven where water, cleaning chemicals, and other contaminants are evaporated and drawn away from the parts. The center (welding) chamber, which is backfilled with dry nitrogen, contains the welding apparatus. The third (exit) chamber is a double door pass-through purged with dry nitrogen to prevent back streaming of air and water vapor into the welding chamber. The parts are passed directly from the vacuum bake chamber to the welding chamber. The lid and package are hermetically welded together (sealing in the dry nitrogen) by a series of overlapping spot welds. Loose internal particles are not created with this process, as can occur when using a solder or epoxy to fasten the lid. Also, there is no flux needed, as with some solders, which would contaminate the internal atmosphere. And finally, the joint is environmentally stronger than can be provided with either a solder or epoxy lid.

The major disadvantage of Kovar, however, is that it has a low thermal conductivity. The use of Kovar in microcircuit packages is, therefore, limited to the packaging of low power semiconductor devices. The maximum electrical power a Kovar package can dissipate is approximately one watt per square inch without overheating the housed semiconductor device and adversely affecting its electrical characteristics. Metals with higher thermal conductivity, like cold rolled steel, molybdenum, aluminum, and copper are, therefore, often used for constructing hybrid microcircuit packaging for high power semiconductor devices. In some applications, copper is the only practical material with high enough thermal conductivity to dissipate the heat generated by several high power semiconductor devices packaged as densely as they typically are in a hybrid.

Use of copper in this context has disadvantages which must be considered if it is used as hybrid package material. First, its coefficient of thermal expansion is considerably different from the ceramic substrates and glass seals. An assembled microcircuit cannot be designed which expands and contracts at the same rate as the copper bodied package, resulting in an assembly having inherent thermal stresses. Second, copper has an annealing temperature of 375° C. If processed above this temperature, as typically is necessary in the high temperature brazing process utilized in the prior art, copper will change from relatively elastic to plastic, or inelastic material. Like all plastic materials, any force which causes stress in excess of the material's yield strength will cause a permanent physical deformation of the part. Such deformation can cause cracked substrates and loss of hermeticity in the assembled device.

In addition to the deformation problem, annealed copper can only be strengthened by hardening through cold working of the copper, which is not practical with a machined part. Beryllium can be added to the copper to make it hardenable by a heat treating process, but even adding a small amount of Beryllium reduces the advantage of the material in the first place. Finally, hermetically sealing a lid to a copper bodied package must be limited to a low temperature soldering or brazing process. Such a process requires care in selecting a material that either melts at a temperature low enough that does not damage the internal assemblies, or one where the process heating can be localized enough to prevent exposure of the internal components of the package to excessive heating. Equipment for perimeter, or seam sealing can be used for soldering, but in order to localize the heating, a lid of low thermal conductivity and high electrical resistance, such as Kovar, must be used to effect the contact resistance heating. This, of course, results in another mismatch between the lid and copper body, which will stress the weaker solder alloy causing eventual hermetic failures.

Four different basic package configurations have been adopted in the prior art to deal with the various combinations of problems and criteria outlined above.

The first, sometimes referred to as a non-expansion controlled package, includes a thermally conductive body and integral side walls made from the materials like copper, dispersion hardened copper, etc. These packages typically exhibit a coefficient of thermal expansion much higher (approximately 16 ppm/deg. C.) than that of the ceramic cards (approx. 7 ppm/deg. C.). This copper package configuration, however, has the major disadvantage of not having a suitable top surface for seam welding a lid in place to ensure a strong hermetic device without the risk of internal contamination. Consequently, the side walls usually require attaching along their perimeter of a thin skin or a seal ring of high electrically resistant material, like Kovar, stainless steel, or cold rolled steel, to permit seam sealing to a similar high resistance material cover by a conventional resistance welding technique. A seal ring is a thin window-frame shaped piece of metal which is attached to the top of the copper side wall to provide a low thermal conductivity welding surface.

To overcome the disadvantage of the first type of package, a second prior art approach is low-temperature brazes a side wall of low thermal conductivity metal onto a copper bottom. This type of package, defined as quasi-expansion controlled, consists of a thermally conductive metal such as copper, dispersion hardened copper, etc. with a high coefficient of thermal expansion and side walls of Kovar with a low coefficient of thermal expansion (approximately 7 ppm/deg. C.). The Kovar side walls restrict the expansion of the body during temperature excursions. These packages are typically smaller in size (less than 2"×2") as the average expansion of the package does not exactly match that of the ceramic card. Kovar side walls permit glass sealing of feedthroughs and ease of resistance welding the cover. This configuration can be sealed in a seam sealer and does have a high thermal conductivity package bottom to remove heat generated by internal components during use, but the disadvantage of this configuration is the low strength of the braze joint between the side wall and the copper bottom, resulting from the low temperature braze (less than 375° C.) which is necessary to ensure that the copper is not softened and weakened. The difficulty with this package is similar to that of the first, in that the braze joint is between two very dissimilar materials whose thermal coefficient of expansion differences are enough to compromise the strength of the joint during thermal exposures.

A third category of device is defined as a controlled-expansion package where the body, consisting of materials like Molybdenum, Copper-Tungsten, etc., has the coefficient of thermal expansion approximating (5-9 ppm/deg. C.) that of side walls made of Kovar. The typical method of attachment of the dissimilar materials comprising the body and the side wall is brazing and as typical of brazed joints, the reliability is questionable.

Another type of device results from a process where a seal ring or side wall is high-temperature brazed onto the bottom member. In this configuration, the side wall or ring can be attached with a cover in a seam sealer and the braze joint is strong enough to withstand environmental testing. The disadvantage, however, of this configuration is that high temperature brazing is done well above the 375° C. softening temperature of copper, and where the bottom is made of copper, its strength is compromised, causing it to yield to thermal mismatch of other materials used in the hybrid devise assembly, i.e., the ceramic substrate.

Still another process is to machine the entire package from a solid copper piece of the required hardness and electron beam weld a seam seal to a thermally low conductivity ring at the rim of the package. Electron beam welding, due to its concentrated heat applied for a very brief time, does not soften the copper. This approach, even if it is performed satisfactorily, requires excessive machining and suffers from poor yields because in order to maintain required cosmetics and assurance of hermeticity, the machining of the copper package must be performed in two stages. The first stage produces an oversized rim which, after electron beam welding, is finish machined to eliminate the cavities and slag caused during the electron beam welding. Also, due to the difficulty of maintaining a consistent electron beam, frequent blow-outs occur, resulting in loss of the hermetic joint and requiring the package to be scrapped.

Considering the aforesaid prior art problems of matching performance criterea and material selection to the methods of fabricating hybrid microcircuit packages, it is the primary object of the present invention to provide a process for producing such packages which can utilize a high thermal conductivity material, such as copper, but at the same time avoids the problem of softening the material during assembly and destroying its useful characteristics.

A second object of the invention is to employ the advantages of explosive clading of dissimilar metals to eliminate the need for brazing or electron beam welding of the package body material during fabrication of a high power hybrid microcircuit package.

A still further object of the present invention is to provide a high thermal conductivity hybrid microcircuit package having a copper body which optimizes cost and efficiency considerations.

Another object of the invention is to provide a package of the type described which can be assembled, seam sealed, and successfully subjected to harsh environmental testing, similar to a Kovar package but having vastly superior thermal conductivity properties than a Kovar package.

Another object of the invention is to provide a process for manufacturing a microcircuit package which can provide the required thermal conductivity while at the same time permitting, in the process of manufacture, welding technique to obtain a sound hermetically sealed joint with the package lid without adversely affecting the significant properties of the body material.

SUMMARY OF THE INVENTION

The invention contemplates a hybrid microcircuit package and the method of making it, comprising a body and side walls of a material having a high coefficient of thermal conductivity, such as the device, having a copper body, in the example described above as a first type of device. The package also includes a seal ring, or superimposed frame, mounted on the top edge surface of the side wall structure to permit the attachment thereto of a lid or cover by traditional resistance welding techniques without overheating and softening the body material. The seal ring, or welding ring, is attached to the side wall of the package by the process of explosive clading which is done prior to the body material being machined into the package configuration.

THE PRIOR ART

Explosive bonding of metals is an art that dates back at least into the 1960's. It is generally described in U.S. Pat. No. 3,360,848 and the patents referred to therein. More recently, explosive clading has been used to bond integrated circuits to the substrate in microcircuit packages, as disclosed in U.S. Pat. Nos. 3,736,654, 3,737,986 and 3,739,614. Other applications of explosive bonding in microelectronics applications are shown in U.S. Pat. Nos. 3,720,986 and 3,998,374. Relevant hybrid microcircuit package construction is disclosed in U.S. Pat. Nos. 4,266,090, 4,506,108, 4,640,438 and 4,649,229. None of the foregoing patents disclose or suggest the process which is the subject matter of this invention.

DESCRIPTION OF THE DRAWINGS

FIG. 1 is a diagramatic perspective view of the setup for the explosive cladding process showing dissimilar metals initially spaced apart and an explosive charge driving the one against the other to effect the cold weld joint therebetween.

FIG. 2 is a diagramatic view of a clad metal block having been cut into a series of steps which are machined and cut into individual package bodies, as shown in FIG. 3.

FIG. 3 is a perspective view of a microcircuit package body after having been cut from a strip as shown in FIG. 2.

FIG. 4 is a cross-sectional view taken along lines 4—4 of FIG. 3.

FIG. 5 is a cross-sectional view similar to that of FIG. 4 but showing a bottom portion of the body of one material and the side walls of a second material, the two being clad together in the process diagramed in FIG. 1.

FIG. 6 is a perspective view of the housing after receiving the side wall borings for the lead assemblies.

FIG. 7 is a perspective view of the housing showing the lead assemblies in place.

FIG. 8 is a perspective view of the housing showing the microcircuit components installed in the package.

FIG. 9 is a perspective view of the package with the lid in place, having been sealed to the top edge of the upstanding side walls.

DETAILED DESCRIPTION OF A PREFERRED FORM OF THE INVENTION

The nature of the product as an item of manufacture will become apparent from a description of the process of its manufacture. The process will be described for a product having a copper base and side walls upon which is superimposed a welding ring of Kovar, although it is understood that the invention is not limited to those materials. Other combinations of materials may be used, depending on the package specification, such as molybdenum or copper-tungsten as a body material and Kovar as a ring material. It is also to be understood that although a welding ring construction surmounting an integral body side wall will be primarily illustrated and described, the invention includes other and different combinations, including a body of one material and side walls of another.

As is known in the subject technology, a typical microcircuit package comprises a box-like body 2 having a flat bottom 4 and upstanding side walls 6, either integral with the bottom or attached thereto by an appropriate fastening process. A lid or cover 8 is sealed to the top edges of the side walls 6 to hermetically enclose the microcircuit components 10, including the substrates. The microcircuit components inside the package communicate through a plurality of leads 12 penetrating the side walls through apertures 14.

Novel to the present invention, the package elements also include a clad Kovar sealing (or welding) ring 15 surmounted on the top edges of the side walls 6.

The manufacturing process begins, as shown in FIG. 1, by placing a plate of metallurgically hard, elastic and typically oxygen-free high thermally conductive copper at a precalculated distance away from a sheet of Kovar. An explosive charge is placed on the upper surface of the Kovar sheet and detonated, forcefully driving the Kovar sheet into the plate of copper, cold welding the two metals together in an inseparable hermetic bond. The explosive cladding process does not overheat the copper, allowing it to retain all the metallurgical properties for which it was selected.

Following the cladding operation, the joined metal sheets are cut into strips or bars of the width of a package, as shown in FIG. 2, and machined to define the cavities of individual respective packages which emerge when those individual package units are cut from the bar along lines dividing the various cavities. An individual package after separation from the bar is seen in FIG. 3 where all parts of the box-like package body are typical, as previously described, except the rectangular seal ring 15 clad to the top edge of the upstanding side walls 6. The ring 15 is all that remains of the Kovar sheet after machining the cavity into the body 2 of the package block.

After the holes 14 are drilled through the side walls 6, the product may be corrosion plated. The next step is to low temperature braze the lead assemblies into the side walls 6 using an alloy such as 80% gold and 20% tin, as shown in FIG. 7. The brazing is done with a temperature of approximately 320° C. which is below the annealing temperature of the copper body, but above the temperature of any subsequent operation on the package, including environmental testing.

As shown in FIG. 8, the microcircuit substrates 10, typically made of alumina or beryllia ceramic to carry the high power semiconductor devices, are soldered or alloyed to the bottom 4 of the housing package in order to achieve the necessary high thermal conductivity to the base member of the housing during use of the device. The interconnection, or soldering together of the substrates and the copper base, creates a bimetallic strip which deforms or bows and then returns to original position with each temperature cycle.

After the interconnections are made between the substrates 10 and the leads 12, the package is ready for final sealing. The cover 8 is placed upon the seal ring 15 and is resistance or spot welded to the seal ring using a conventional seam sealer. Inasmuch as the cover 8 is made of the same material as the seal ring, for example high electrically resistant Kovar, the welding process may proceed at a temperture high enough to provide a hermetic joint with high structural integrity.

It is thus apparent that the explosive cladding of the copper and the Kovar and the high temperature welding of the Kovar lid to the Kovar seal ring accomplishes the objectives of the invention in providing dependable hermetically sealed joints in the microcircuit package while maintaining the elasticity and high thermal conductivity of the copper in order to accommodate the necessary heat dissipation of the high power device.

I claim:

1. The method of manufacturing a high power hybrid microcircuit package including:

explosively bonding a seal ring to the top walls of a metallurgically hard, elastic, high thermally conductive base member having upstanding side walls together defining an interior volume, said bonding being accomplished so that the base member is not softened in the explosive process.

2. The method of manufacturing a housing into which microcircuit components may be placed, including:

exlosively bonding first and second dissimilar metals to produce a base member;

machining the base member to produce a flat bottom portion with upstanding side walls defining an interior volume in the first metal and defining a second metal ring surmounted on the side walls.

3. A method of manufacturing a microcircuit housing, comprising the steps of:

explosively cladding first and second dissimilar metals to create a solid block of material having the first metal as one surface thereof and the second metal as an opposing surface thereof;

creating a cavity in the said block which opens through the first metal and into the said second metal wherein said first metal is converted to comprise a ring surmounted on the perimeter of the cavity produced in the second metal;

mounting electrically conductive leads through the block;

inserting semiconductor components into the cavity and attaching the leads thereto; and sealing a cover onto the said ring.

4. The method of claim 3 wherein the sealing of the cover is done by electrical resistance welding.

5. The method of claim 3 wherein the sealing of the cover is done by laser welding.

6. A method of manufacturing a microcircuit housing, comprising the steps of:

explosively cladding first and second dissimilar metals to create a solid block of material having the first metal as one surface thereof and the second metal as an opposing surface thereof;

creating a cavity in the said block which opens through the first metal to just expose the second metal as a bottom surface of the cavity and wherein the first metal defines the side walls of the cavity;

mounting electrically conductive leads through the said side walls inserting semiconductor components into the cavity and interconnecting the leads thereto; and sealing a cover onto the top surfaces of the said side walls.

7. The method of claim 6 where the step of sealing the cover includes welding of the cover to the upstanding side walls.

8. The method of claim 6 where the step of sealing the cover includes laser welding the cover to the upstanding side walls.

9. A method of manufacturing a hermetically sealed microwave package having controlled expansion characteristics, said method comprising:

explosively bonding a layer of material to opposite sides of a block of copper, molybdenum or copper alloy, each of said layers being of a material having a low coefficient of thermal expansion in comparison to said block;

machining through one of said layers and removing material from said block to form a receptacle therein;

forming lead openings in said one of said layers;

attaching a ceramic substrate to the bottom of each receptacle;

extending feed-through wire through said lead openings and connecting them to said substrate;

placing a cover over said one of said layers which is made of the same material as said one of said layers; and hermetically sealing said cover to said one of said layers.

10. A method as claimed in claim 9, wherein:

said block is an elongated bar;

a plurality of receptacles are machined in said bar; and said bar is cut between said receptacles to form separate packages.

* * * * *